United States Patent
Moyer et al.

(10) Patent No.: US 7,148,078 B2
(45) Date of Patent: Dec. 12, 2006

(54) INTEGRATED CIRCUIT PACKAGE PROVIDED WITH COOPERATIVELY ARRANGED ILLUMINATION AND SENSING CAPABILITIES

(75) Inventors: Vincent C. Moyer, Milpitas, CA (US); Michael J. Brosnan, Fremont, CA (US)

(73) Assignee: Avago Technologies EGBU IP (Singapore) Pte. Ltd., Singapore (SG)

( * ) Notice: Subject to any disclaimer, the term of this patent is extended or adjusted under 35 U.S.C. 154(b) by 162 days.

(21) Appl. No.: 10/784,487

(22) Filed: Feb. 23, 2004

(65) Prior Publication Data

US 2005/0186710 A1    Aug. 25, 2005

(51) Int. Cl.
*H01L 21/00* (2006.01)

(52) U.S. Cl. .............................. 438/65; 438/56; 438/64; 438/106; 438/123

(58) Field of Classification Search ............... None
See application file for complete search history.

(56) References Cited

U.S. PATENT DOCUMENTS

| | | | | |
|---|---|---|---|---|
| 5,349,371 A | * | 9/1994 | Fong | ........................... 345/166 |
| 5,463,387 A | * | 10/1995 | Kato | ........................... 341/31 |
| 6,292,274 B1 | | 9/2001 | Bohn | |
| 2002/0080117 A1 | * | 6/2002 | Son et al. | ................... 345/163 |
| 2003/0075674 A1 | | 4/2003 | Anderson et al. | |
| 2003/0112220 A1 | * | 6/2003 | Yang et al. | ................. 345/156 |

FOREIGN PATENT DOCUMENTS

JP    360035244 A   *   2/1985

* cited by examiner

*Primary Examiner*—Michael Trinh
*Assistant Examiner*—Khanh Duong

(57) ABSTRACT

An integrated circuit package includes an angled one-piece substrate having a light source fixed to one area and a sensor die fixed to a second area, such that the light source is directed to illuminate the field of view of the sensor die when a surface of interest is imaged. The integrated circuit package is well suited for generating navigation information regarding movement relative to a surface. In one method of forming the integrated circuit package, the single-piece substrate is originally a generally flat lead frame to which the sensor die and light source are attached. After the components have been connected, the lead frame is bent to provide the desired light source-to-sensor angle. In an alternative method, the lead frame is pre-bent. For either method, optics may be connected to the integrated circuit package, thereby providing a module that includes the optics, the light source, the sensor and the packaging body.

13 Claims, 7 Drawing Sheets

INTEGRATED CIRCUIT PACKAGE PROVIDED WITH COOPERATIVELY ARRANGED ILLUMINATION AND SENSING CAPABILITIES

BACKGROUND ART

There are a variety of applications for integrated circuit packages having embedded sensors. The sensor may have a single pixel element or may be a matrix of pixel elements, which individually generate an electrical signal that is responsive to the intensity of received light.

In one category of applications, embedded sensors are used in electronic devices that employ optical navigation as a means for operation. For example, hand-held scanners and computer mice may include "optical navigation engines" to track movement along a surface. The engine may be contained within a single integrated circuit package and may include an image acquisition system and an image processor. In operation, the engine identifies texture or other features of the surface being imaged and generates navigation information on the basis of the imaged features. As one possibility, the sensor captures a succession of image frames and the processor identifies common features within two frames and determines the distance between the common features from the first frame to the second. Such information can then be translated into X and Y coordinates to indicate movement of a scanner, mouse or other device.

FIGS. 1 and 2 illustrate one possible embodiment of an assembly having navigation capability. An assembly of this type may be used in an optical mouse or a hand-held scanner. In FIG. 1, the assembly is shown as being in a position to image a surface of a substrate 10, such as a mouse pad or a desktop. FIG. 2 shows the assembly in an exploded view. The assembly includes an integrated circuit package, which may be referred to as the sensor 12 because it includes an embedded sensor die 14. The downwardly extending leads of the sensor are attached to a corresponding set of vias of a printed circuit board 16 to provide mechanical and electrical coupling of the sensor to the assembly. A light emitting diode (LED) 18 is also mechanically and electrically connected to the printed circuit board. Mechanical coupling, as well as optical coupling, can be enhanced by use of a plastic clip 20 to provide a light mechanical compression on the top of the sensor 12 and to properly seat the LED.

A single-piece lens system 22 includes both a prism feature and a collection feature. A pyramidal region 24 provides the prism feature, wherein light from the LED 18 is reflected first downwardly and then at the desired angle for illuminating the surface of the substrate 10. Light reflected from the surface is collected by a lens 26 and directed to the embedded sensor die 14. In FIG. 2, the lens 26 is located within an optical window 28.

The lens 26 includes a ring portion 30 that is dimensioned to correspond to a stepped area 32 of a base plate 34. In addition to the corresponding dimensions, the proper alignment of the lens system 22 to the base plate 34 is ensured by an alignment post 36 that extends through an opening 38 of the printed circuit board 16 and by a raised feature 40 that contacts the lens 26 (as best seen in FIG. 1).

The assembly of FIGS. 1 and 2 is merely one example of an approach for providing the precise alignment of the necessary components. While the known approaches operate well for their intended purposes, they involve exacting manufacturing tolerances and assembly procedures.

SUMMARY OF THE INVENTION

An integrated circuit package in accordance with the invention includes a light source and an integrated circuit die having a sensor, with the light source and the sensor being angled such that emitted light illuminates the field of view of the sensor. Within the integrated circuit package, a single-piece substrate has a nonlinear surface that defines the desired light source-to-sensor angle. The surface includes one or more sharp bends or regions of curvature to provide the target relationship between illumination and sensing. The integrated circuit die is fixed to a first area of the single-piece substrate, while the light source is fixed to a second area. The two components are enclosed within the package, but at least one optical window is positioned to allow image light to exit and re-enter.

As one possible method of forming the integrated circuit package, the single-piece substrate is originally a generally flat lead frame having an array of input/output conductors and having the first and second areas for receiving the die and light source, respectively. A first portion of the insulative package body is formed about the first area of the lead frame and a second body portion is formed about the second area. The die is then fixed in the first area and the light source is fixed in the second. For example, die attach and wire bond techniques may be used to mechanically and electrically connect the components to the lead frame. Thus, the light source may also be a die, such as a VCSEL chip (Vertical Cavity Surface Emitting Laser chip).

After the "sensor die" and the light source have been fixed to the different areas of the lead frame, the lead frame is bent at least once in the region between the two areas so as to establish the desired angle. One means for maintaining this angle is to provide the first and second package portions with structural features which are mechanically coupled when the lead frame is bent into the desired position.

In an alternative method of forming the integrated circuit package, a package body of electrically insulative material is formed on the lead frame so as to establish the desired angle prior to fixing the sensor die and the light source to their respective areas of the lead frame. Because the lead frame is bent, it may be beneficial to attach the sensor die and the light source in separate "passes" through a die-attach station (e.g., an assembly machine).

Within either of the two above-described methods or within a separate method, the necessary optical elements may be mechanically coupled to the integrated circuit package, so that a module is formed for use within an electronic device, such as a computer mouse. Such a module would include the light source, the sensor, the light-directing optics and the electrical connectivity. A possibility for the electrical connectivity is to include lead frame leads that are soldered to a printed circuit board of the electronic device.

DETAILED DESCRIPTION

Figure 3:
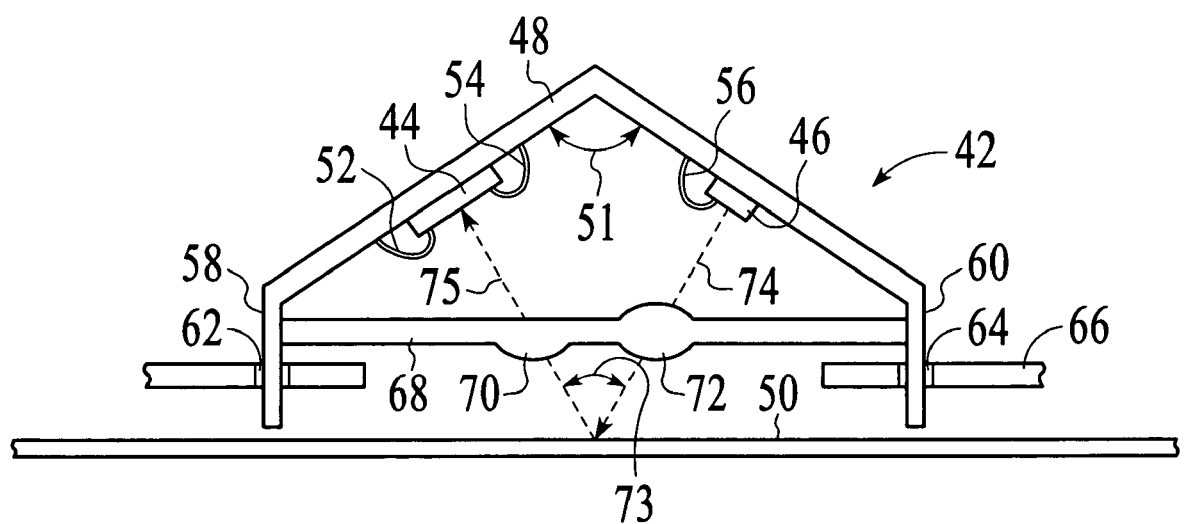
FIG. 3 is a side view of an integrated circuit package having a sensor-containing integrated circuit and a light source on an angled single-piece substrate in accordance with one possible embodiment of the invention.

With reference to FIG. 3, one embodiment of an integrated circuit (IC) package 42 having an embedded sensor die 44 and an embedded light source 46 is shown. The sensor die and light source are fixed to angled areas of the single-piece substrate 48. The angle is selected such that light from the light source illuminates the field of view of the sensor die, but not in the manner in which the arrangement merely enables detection of occurrences in which the path between the light source and the sensor has been interrupted. Rather, the light source provides "image light" for imaging a surface 50, such as the surface of a paper or computer mouse pad. As used herein, "image light" refers to light reflected from a surface of interest and received by a sensor. The image light may be converted into digital signals by a single pixel element or by a matrix of pixel elements. For the application in which the sensor is used to generate navigation information, a matrix of elements provides more reliable results.

As will be described more fully below, the single-piece substrate 48 may be a lead frame having either a bent or curved region. The angle of the area on which the sensor die 44 is fixed relative to the area on which the light source 46 is fixed is preferably in the range of 30° to 175° and more preferably in the range of 45° to 100°. This angle is represented in FIG. 3 by curved line 51. For applications in which the substrate 48 is a lead frame, the sensor die may be fixed to the lead frame using conventional die attach techniques. Electrical connections may be formed by wire bonds 52 and 54. In some applications of the invention, the light source 46 is also an IC die, so that the light source is die attached and is electrically connected by at least one wire bond 56. For example, the light source may be a VCSEL chip.

Electrical connectivity of the single-piece substrate to other components of a system may be provided by leads 58 and 60. For embodiments in which the single-piece substrate is a lead frame, the leads are bent end portions, as is known in the art. The leads extend through conductive vias 62 and 64 of a printed circuit board 66. While not shown in FIG. 3, the printed circuit board includes a means for maintaining a set distance from the surface 50 being imaged. For example, low friction feet may be attached to the printed circuit board or to a casing that houses the printed circuit board and one-piece substrate 48.

The embodiment of FIG. 3 includes a lid 68 having a pair of optical windows 70 and 72. The optical window 72 is aligned with the beam axis 74 of light generated by the light source 46. This optical window may be configured to provide collimation, focusing, or other beam manipulations. Multiple stage manipulations may be provided by a more complex optical window, such as one that includes a pair of reflections to achieve a "grazing angle" (i.e., less than 15°) as light reaches the surface 50 being imaged. The receiving optical window 70 is aligned and may be used with the axis 75 of the sensor to collect the image light reflected from the surface 50. However, in some embodiments the windows are "optically passive" and any desired optical manipulations are provided by separate optical elements.

Where the single-piece substrate 48 is a lead frame, encapsulant material is typically used to form the package body. For purposes of simplifying illustration of the invention, the encapsulant material has been omitted from FIG. 3. Ceramic-based or plastic-based material may be used. Often, the encapsulant material is molded into place on the lead frame during the process of forming an IC package. The lid 68 may be snap-fit to the molded package body, so that the IC package 42 is a module that can be easily connected within a system. Such a module would include the light source 46, the sensor 44, the optics 70 and 72, and the package body. While the module could include leads 58 and 60 for connection to a printed circuit board 66, other known techniques for enabling the connectivity may be substituted. As one example, a ball grid array may be formed on the surface of the module.

Figure 4:
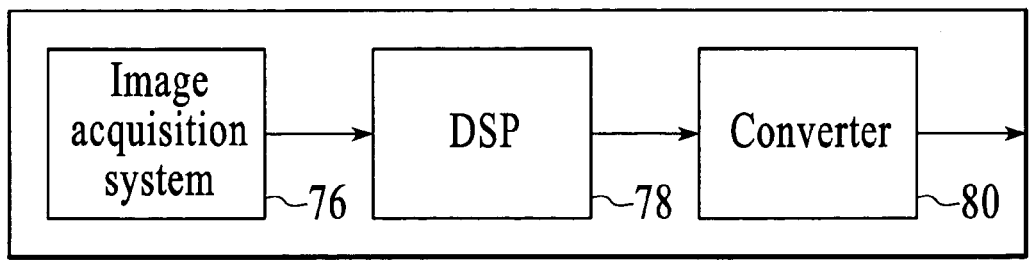
FIG. 4 is a block diagram of an optical navigation engine which may be employed in the integrated circuit of FIG. 3.

Referring now to FIGS. 3 and 4, the sensor die includes an image acquisition system 76, digital signal processing 78 (DSP), and a converter 80. The image acquisition system is primarily the sensor and the sampling circuitry and software for forming successive frames of image information. The DSP then manipulates the frames to generate the desired results. For example, the sensor die may acquire 1,500 frames per second and may compare the most recent image to one or more previously acquired images to determine the direction and speed of movement. The converter 80 is an optional element that is used to properly format the results for communication to other components of the overall system, such as in the use of position tracking within a computer mouse.

Figure 1:
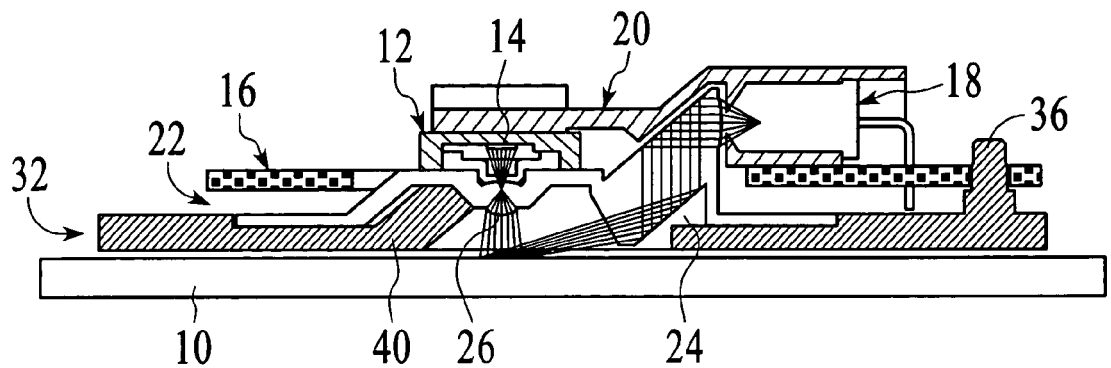
FIG. 1 is a side cross sectional view of a prior art assembly for illuminating and imaging a surface of interest.
Figure 2:
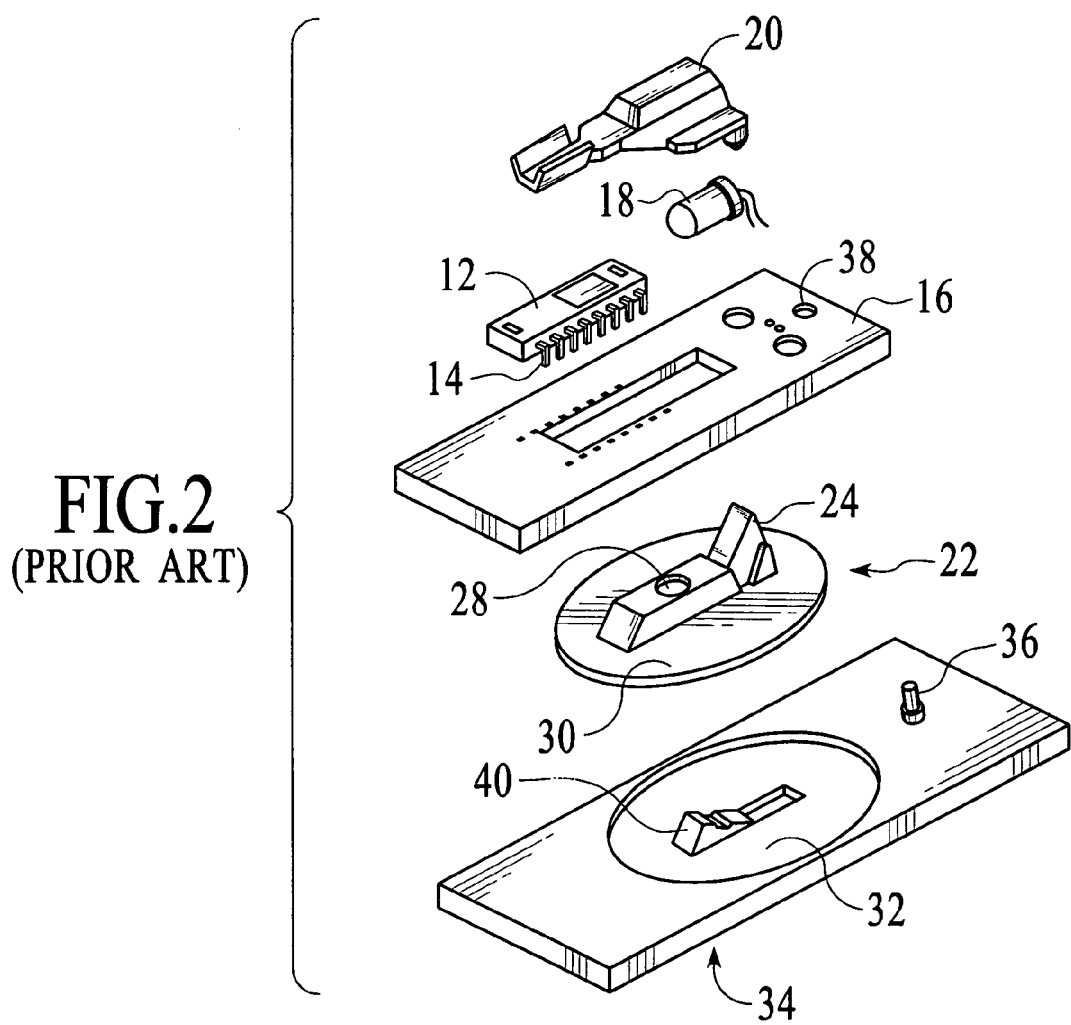
FIG. 2 is an exploded view of the assembly of FIG. 1.
Figure 5:
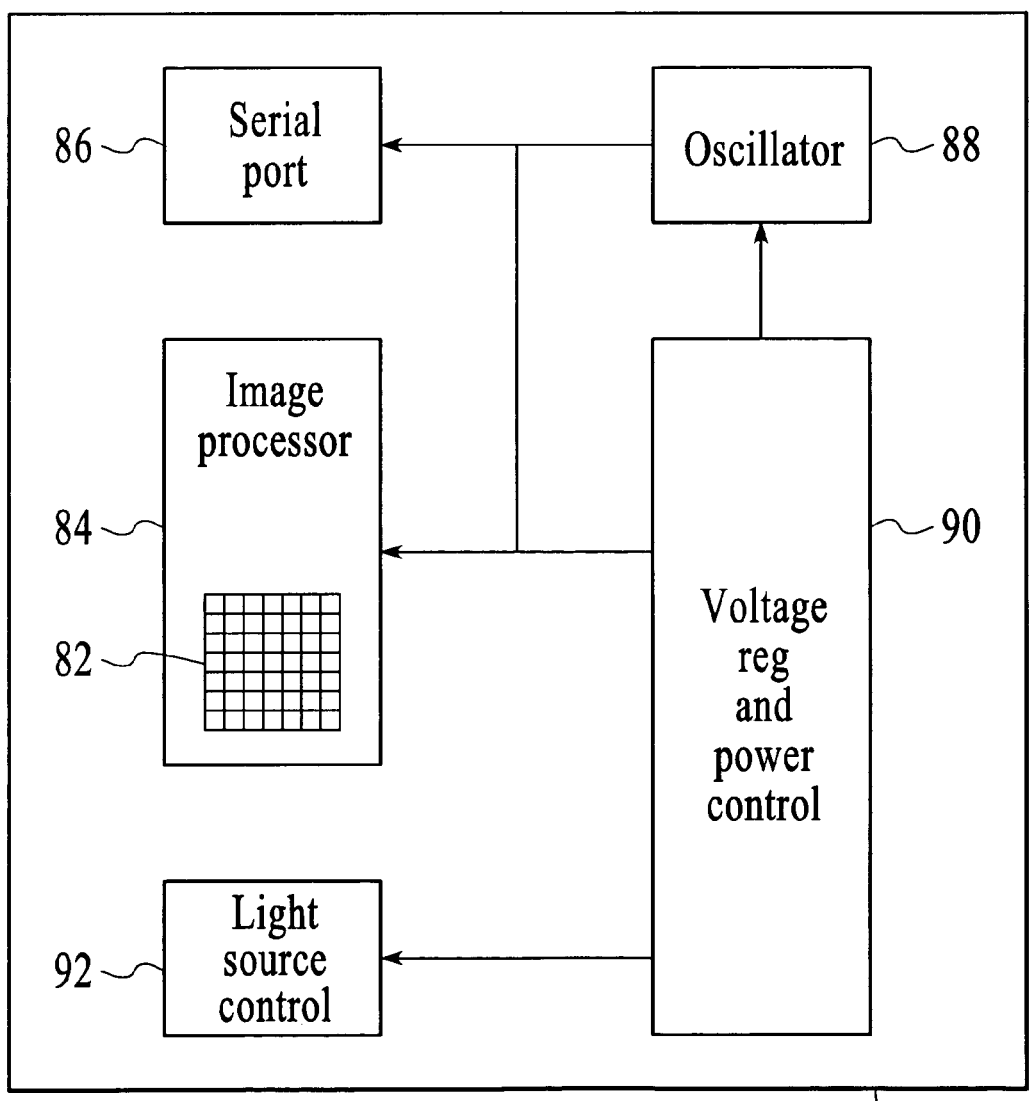
FIG. 5 is a block diagram of components as one example of the sensor-containing integrated circuit die of FIG. 3.

Merely by way of example, the sensor die 44 of FIG. 1 may be identical to the one embedded within the optical mouse sensor sold by Agilent Technologies under the part number ADNS-2610. A block diagram of functional elements of the optical mouse sensor is shown in FIG. 5. A matrix 82 of photo-sensitive, or pixel, elements cooperates with an image processor 84 to provide the image acquisition system 76 and DSP 78 of FIG. 4. The image processor is connected to a two-wire serial port 86 for transmitting and receiving electrical signals to and from other components. An oscillator element 88 may be connected to a resonator and may be used to regulate timing of operations for the image processor 84. Voltage regulation and power control are provided by element 90. The light source control element 92 provides timing for the light source 46 of FIG. 3, for applications in which the light source is strobed in synchronization with image acquisition.

In operation, the sensor die 44 of FIG. 5 cooperates to provide optical navigation technology which measures changes in position by optically acquiring sequential surface images at a selected frame rate, such as 1,500 times per second. Each frame includes information regarding the texture or other features of the surface being imaged. Then, in comparing two images, common features are recognized, allowing an image-processing algorithm to calculate and identify the direction and distance between the common features. The information is then translated into X and Y displacements indicative of movement.

Figure 6:
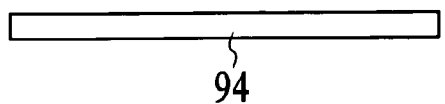
FIGS. 6–13 are paired side and top views of a sequence of steps for forming an integrated circuit package in accordance with the claimed invention.
Figure 7:
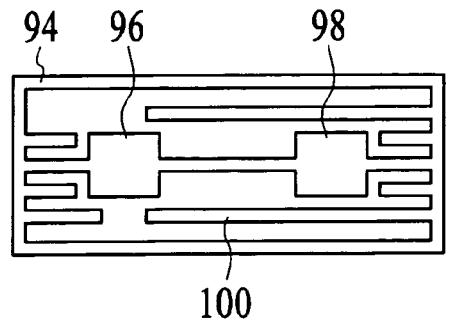

FIGS. 6–14 illustrate one possible sequence of steps for fabricating an IC package in accordance with the invention. With the exception of FIG. 14, each side view is shown next to a top view of the same structure. In FIGS. 6 and 7, a lead frame 94 is provided. As is well known in the art, the lead frame is an electrically conductive patterned member. The lead frame of FIGS. 6 and 7 includes a first area 96 for receiving the sensor die and a second area 98 for receiving the light source. The lead frame also includes a pattern of leads, such as lead 100, for enabling external communication. For simplicity, only a limited number of leads are shown in FIG. 7. In fabrication, the pattern shown in FIG. 7 may be formed by etching or stamping a thin sheet of metal.

Figure 8:
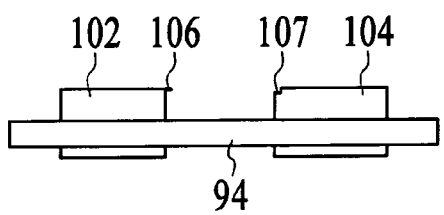
Figure 9:
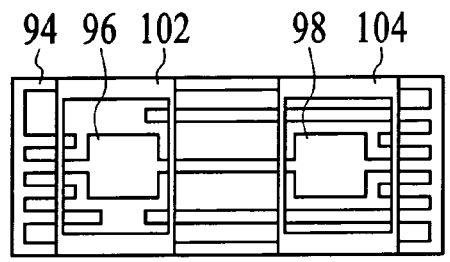

In FIGS. 8 and 9, a first portion 102 of a package body is formed about the first area 96 and a second portion 104 of the package body is formed about the second area 98. As previously noted, the package body may be ceramic-based or plastic-based. Conventional techniques may be used. For example, the two portions may be molded onto the lead frame 94 so as to extend onto both sides of the lead frame and to encase small areas of the leads, thereby securing the molded material in place. While the invention is described and illustrated as being one in which the electrically insulative package body is formed before the attachment of the sensor die and the light source, these steps may be reversed without diverging from the invention.

The first portion 102 of the package body includes a locking mechanism 106 that is configured to be received within an opening 107 of the second portion 104. The use of a hook-shaped extension is simplistic and other approaches may be substituted. Alternatively, the subsequent bending of the lead frame 94 (FIG. 14) may be maintained in a precise position by attaching the lead frame 94 and the package body to another structure, such as a lid that mechanically maintains the correct angle and prevents particle contamination of the embedded components. The lid may include one or more optical elements, but the optical elements may be incorporated into a separate piece.

Figure 10:
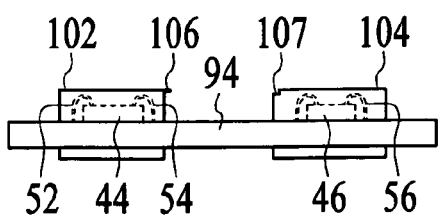
Figure 11:
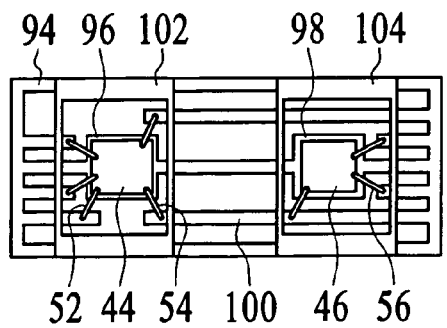

In FIGS. 10 and 11, the sensor die 44 and the light source 46 are attached to the lead frame 94 at the first and second areas 96 and 98, respectively. Additionally, the wire bonds 52, 54 and 56 are attached to electrically couple the two components to the lead frame 94. For example, wire bond 54 is connected to the lead 100.

Figure 12:
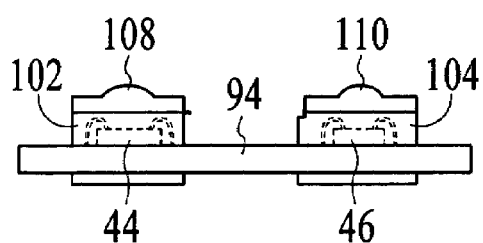
Figure 13:
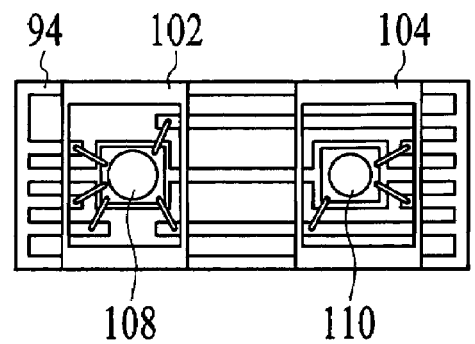

Referring now to FIGS. 12 and 13, separate optical members 108 and 110 are connected to the first and second body portions 102 and 104, respectively. The optical members may be friction fit to the body portions or may be attached using some other mechanism. Each optical member is configured to manipulate light in a predetermined manner. For example, the optical member 108 is aligned with the axis of the sensor within the sensor die 44 to collect image light entering the interior of the first body portion 102.

Figure 14:
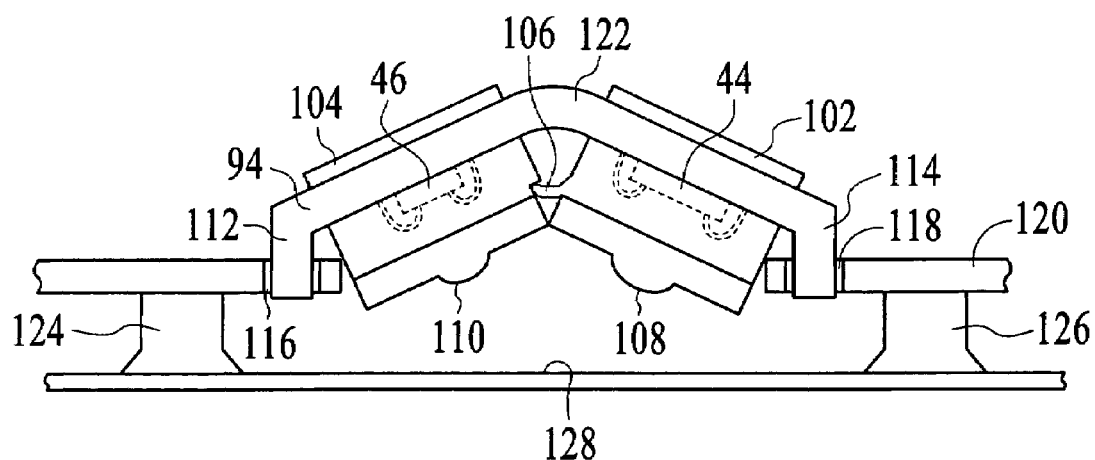
FIG. 14 is a side operational view of the integrated circuit package formed in accordance with the steps of FIGS. 6–13.

In FIG. 14, the exposed ends of the lead frame 94 are trimmed and then bent to form downwardly depending leads 112 and 114 that are received within conductive vias 116 and 118 of a printed circuit board 120. The lead frame 94 also includes a central bend 122. The previously described locking mechanism 106 secures the two body portions 102 and 104 in a relationship that defines the relative angle of the sensor die 44 to the light source 46. Again, other means for securing the body portions in a predetermined relationship may be substituted. Merely as one example, a continuous member that provides both the optical manipulations of members 108 and 110 may be used to precisely position the body portions. While less desirable in some applications, since it reduces the level of integration into a single module, the optical manipulations may be provided by a separate member that is not introduced until the lead frame is connected to the printed circuit board 120.

In operation as an optical mouse, low friction feet 124 and 126 properly space the printed circuit board 120 from a surface 128 to be imaged. With the lead frame 94 precisely bent, the light source 46 illuminates the field of view of the sensor die 44. As a consequence, the micro features of the surface may be imaged and used as the basis for generating navigation information.

Figure 15:
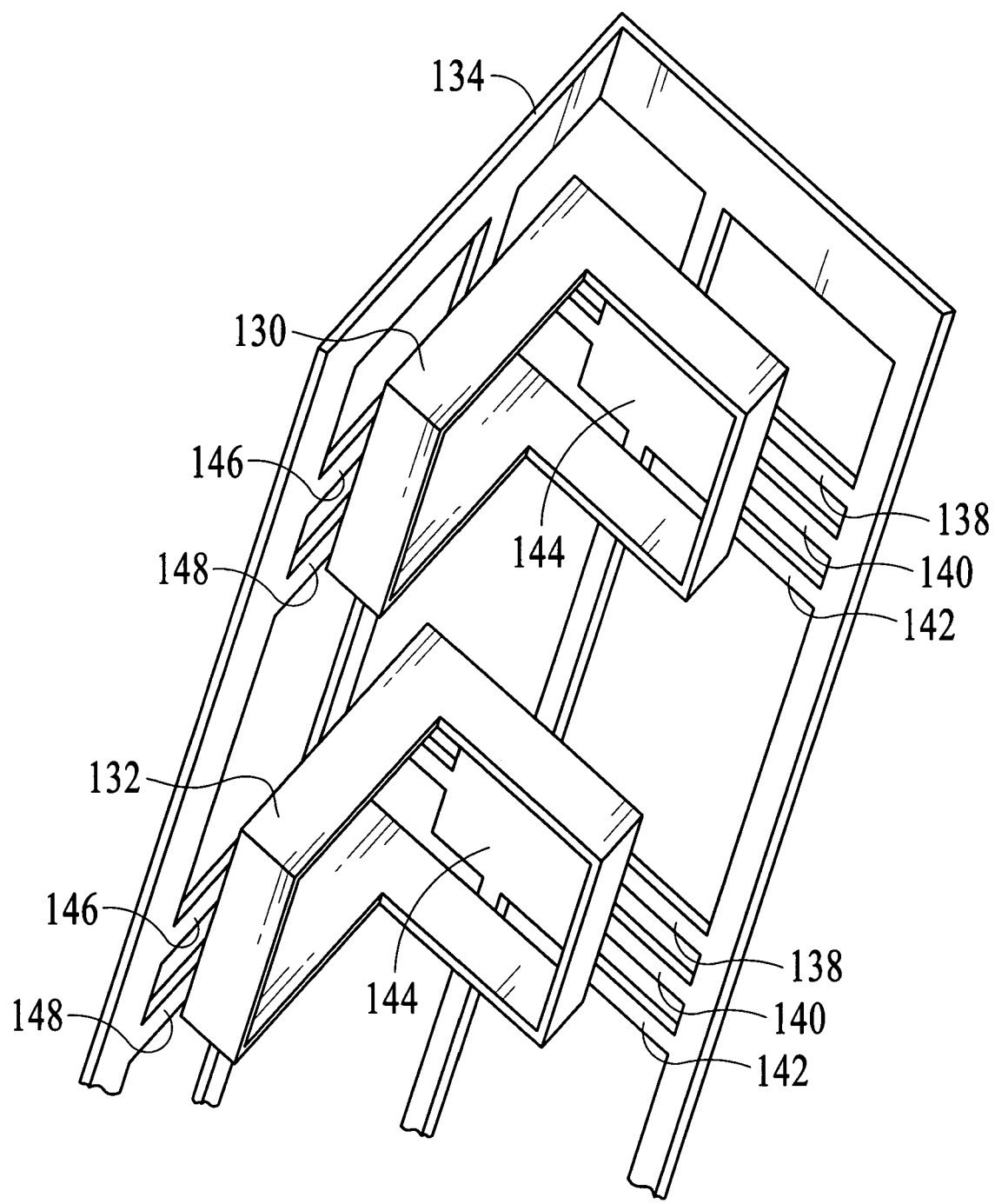
FIG. 15 is a perspective view of a structure formed upon completion of an intermediate fabrication step in another embodiment of a method for forming the integrated circuit package.
Figure 16:
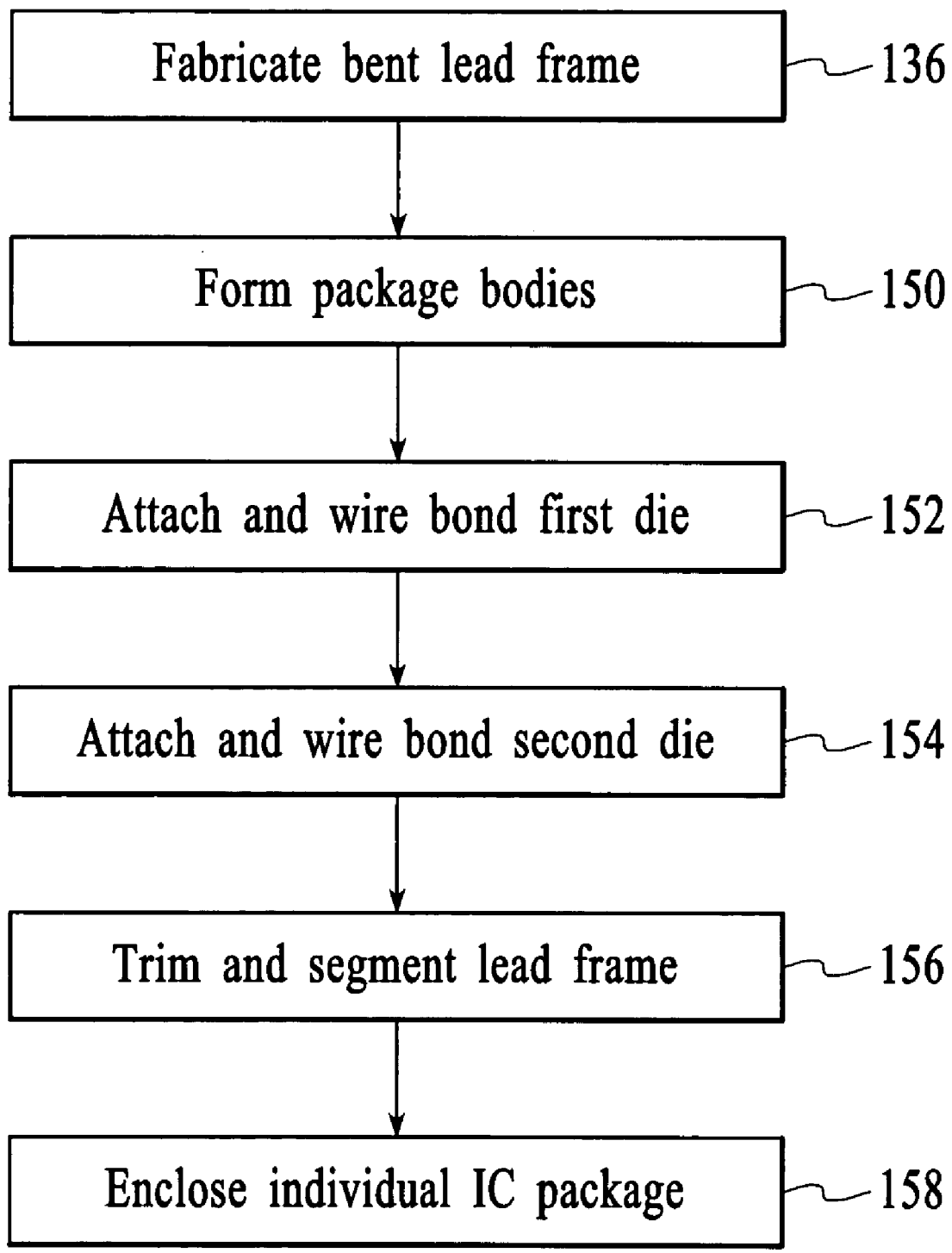
FIG. 16 is a process flow of steps in which the structure of FIG. 15 is formed and then fabrication is completed.

FIG. 16 illustrates an intermediate step in an alternative method of forming an integrated circuit package in accordance with the invention. While the method of FIGS. 6–14 was described with reference to forming a single IC package, it is conventional in the art to fabricate an extended lead frame in which a number of IC packages are formed simultaneously. In FIG. 15, two identical package bodies 130 and 132 are molded onto duplicated lead patterns of a lead frame 134. While the package bodies are shown as being entirely on one side of the metallic lead frame 134, it is typical for the insulative material to extend around the leads, as was described when referring to FIGS. 8 and 9.

The process steps for forming an IC package in accordance with the second method will be described with reference to FIG. 16. At step 136, the lead frame having the preformed bend is fabricated. For example, the repeating pattern of leads may be formed by etching or stamping a metallic sheet. In the simplified example shown in FIG. 15, three leads 138, 140 and 142 extend, into the interior of a first area of the package bodies 130 and 132. This first area includes a platform 144 for receiving the sensor die. Similarly, two leads 146 and 148 extend to the second area of each package body, but the platform within this second area is not shown in FIG. 15.

Following the step 136 of fabricating the bent lead frame, the package bodies are formed at step 150. While it is conventional to form the insulative package bodies prior to attaching the sensor dies, the order can be reversed. Moreover, there may be some applications of the invention in which the sensor die and light source are enclosed using some other means.

As indicated at steps 152 and 154, the sensor die and the light source are attached and wire bonded separately. Typically, assembly machine platforms do not support the attachment and wire bonding of different chips that are at angles to each other. Therefore, separate passes are necessary. However, where possible, steps 152 and 154 are merged.

In FIG. 15, the navigation sensor may be die attached to the platform 144 prior to attaching the light source to the adjacent angled area of the lead frame 134. In some embodiments of the invention, the light source may not be a "die," so that the attachment techniques for implementing step 152 will be different from those of step 154. As another alternative, techniques other than wire bonding may be used to provide electrical connectivity from the die to the leads 138, 140, 142, 146 and 148 of the lead frame 134.

At step 156, the lead frame 134 is trimmed and segmented to separate the IC packages. Each IC package is then enclosed to protect the integrated circuitry from continued exposure to the environment, as indicated at step 158. The enclosure may merely be a lid having a transparent window that allows image light to exit and enter the package. However, there are advantages to fitting optical members to the IC packages, thereby forming modules which integrate the light source, the sensor, the optics and the packaging.

While the invention has been described and illustrated as including a single-piece substrate with symmetry, even after being bent, there may be advantages to providing multiple sharp bends (FIG. 3) or multiple areas of curvature (FIG. 14) that reduce the symmetry. For example, the single-piece substrate may have multiple bends within the region between the sensor die and the light source in order to provide a relationship in which the sensor die is parallel to the surface of interest (e.g., a mouse pad), while the light source is positioned to provide grazing angle (i.e., less than fifteen degrees) illumination of the surface of interest. In the prior art approach of FIG. 1, this relationship is achieved by a lens system 22 that redirects light from the light source 18. In comparison, the present invention could provide grazing angle illumination directly from the light source that is mounted to the same substrate as the sensor die.

What is claimed is:

1. A method of forming an integrated circuit package having a sensor with imaging capability comprising:

connecting components to a single-piece substrate, including fixing an integrated circuit die to a first area of said single-piece substrate and fixing a light source to a second area of said single-piece substrate, said integrated circuit die having said sensor, said single-piece substrate being a lead frame, said fixing of said integrated circuit die including using die attach techniques; and enclosing said components to define said integrated circuit package having exposed input/output connections and having a window optically aligned with said sensor;

wherein said first and second areas of said single-piece substrate are at an angle to each other within said integrated circuit package, such that an axis of light from said light source is non-parallel to an imaging axis of said sensor and such that said light source illuminates a field of view of said sensor, said connecting said components including attaching said integrated circuit die and said light source to said lead frame while said lead frame is substantially flat, said enclosing including bending said lead frame to establish said angle of said first area to said second area; and wherein said method further comprises forming an electrically insulative material on opposite sides of said lead frame prior to connecting said components, thereby defining a package form, said package form being patterned to include a locking mechanism, said bending of said lead frame including utilizing said locking mechanism to fix said lead frame in a position to establish said angle.

2. The method of claim 1 wherein defining said package form includes fabricating separate first and second portions on said lead frame, said first and second portions having cooperative structural features which define said locking mechanism.

3. The method of claim 1 wherein connecting said components includes providing said integrated circuit die to include a matrix of pixel elements and to include digital signal processing circuitry, said angle being selected to establish a light-source-to-sensor relationship in which light from said light source illuminates a surface being imaged by said matrix of pixel elements, said matrix of pixel elements being said sensor.

4. The method of claim 3 wherein enclosing said components includes attaching a lens system for directing said light from said light source and for collecting light reflected from said surface toward said matrix of pixel elements, thereby providing a module for electrical and mechanical connection within an electronic device.

5. The method of claim 4 wherein connecting said components includes providing said integrated circuit die such that said digital signal processing circuitry is dedicated to generating navigation information specific to movement of said sensor relative to said surface being illuminated by said light source.

6. A method of forming an integrated circuit package comprising:

providing a generally flat lead frame having spaced apart first and second areas for receiving components and having a plurality of input/output conductors;

forming a first package portion about said first area of said lead frame;

forming a second package portion about said second area of said lead frame;

fixing a sensor die to said first area, including electrically connecting said sensor die to at least some of said input/output conductors;

fixing a light source to said second area, including electrically connecting said light source to at least one of said sensor die and said input/output conductors; and bending said lead frame in a region between said first and second areas to establish a condition in which light from said light source illuminates a field of view of said sensor die.

7. The method of claim 6 further comprising securing said lead frame in said condition using physical features of said first and second package portions, wherein said first and second package portions are formed using molding techniques.

8. The method of claim 6 wherein fixing said sensor die includes using die attach and wire bonding techniques for a device having a matrix of pixel elements and circuitry dedicated to determining navigation information.

9. The method of claim 6 further comprising attaching a lid to said first and second package portions after said bending, said lid including a lens system for directing said light from said light source and collecting light for said sensor die, wherein attachment of said lid forms a module for connection within an electronic device.

10. A method of forming an integrated circuit package comprising:

fabricating a lead frame having a plurality of input/output conductors, said lead frame having spaced apart first and second areas for receiving components;

forming a multi-portion package body of electrically insulative material on said lead frame, said package body including first and second portions with structural features that define a locking mechanism for selectively securing said first portion to said second portion such that said first and second areas are at a selected angle with respect to each other;

fixing a sensor die to said first area, including electrically connecting said sensor die to at least some of said input/output conductors;

fixing a light source to said second area, including connecting said light source to at least one of said sensor die and said input/output conductors; and engaging said locking mechanism to secure said first portion to said second portion after said sensor die and light source are fixed to said first and second areas, respectively:

wherein said selected angle is such that a condition is established in which light from said light source illuminates a field of view of said sensor die.

11. The method of claim 10 wherein fixing said sensor die includes using die attach and wire bonding techniques for a device having a matrix of pixel elements and circuitry dedicated to determining navigation information.

12. The method of claim 10 further comprising attaching a lid to said package body, said lid including a lens system for directing said light from said light source and collecting light for said sensor die, wherein attachment of said lid forms a module for connection within an electronic device.

13. The method of claim 10 wherein fixing said sensor die includes using die attach and wire bond techniques for a die having a matrix of pixel elements and circuitry dedicated to determining navigation information on the basis of image information from said matrix.

* * * * *

UNITED STATES PATENT AND TRADEMARK OFFICE
CERTIFICATE OF CORRECTION

| | | |
|---|---|---|
| PATENT NO. | : 7,148,078 B2 | Page 1 of 1 |
| APPLICATION NO. | : 10/784487 | |
| DATED | : December 12, 2006 | |
| INVENTOR(S) | : Vincent C. Moyer et al. | |

It is certified that error appears in the above-identified patent and that said Letters Patent is hereby corrected as shown below:

First Page, Column 1, (Assignee), delete "EGBU" and insert -- ECBU --;

Column 8, Line 48 (approx.), Claim 10, delete "respectively:"
and insert -- respectively; --.

Signed and Sealed this

Fifteenth Day of June, 2010

David J. Kappos
*Director of the United States Patent and Trademark Office*